United States Patent [19]

Sharma et al.

[11] Patent Number: 4,946,376
[45] Date of Patent: Aug. 7, 1990

[54] BACKSIDE METALLIZATION SCHEME FOR SEMICONDUCTOR DEVICES

[75] Inventors: Ravinder K. Sharma, Mesa; William H. Lytle, Chandler; Angela Rogona, Phoenix; Bennett L. Hileman, Tempe, all of Ariz.

[73] Assignee: Motorola, Inc., Schaumburg, Ill.

[21] Appl. No.: 333,938

[22] Filed: Apr. 6, 1989

[51] Int. Cl.$^5$ ............ H01L 23/48; H01L 21/58
[52] U.S. Cl. .................... 428/620; 357/70; 357/71; 357/81; 357/82; 428/662; 437/10; 437/12
[58] Field of Search ............ 428/620, 662; 357/70, 357/71, 81, 82; 437/10, 12

[56] References Cited

U.S. PATENT DOCUMENTS

| | | | |
|---|---|---|---|
| 4,144,099 | 3/1979 | Edmonds et al. | 437/10 |
| 4,176,443 | 12/1979 | Iannuzzi et al. | 357/71 |
| 4,574,470 | 3/1986 | Burt | 357/81 |
| 4,737,839 | 4/1988 | Burt | 357/81 |
| 4,835,593 | 5/1989 | Arnold et al. | 357/71 |

OTHER PUBLICATIONS

Kanoda et al. Phys. Rev. B, vol. 35 (1987) 6736.
Smith, J. F., Bull. Alloy Phase Diagrams, 2 (1981) 343.

*Primary Examiner*—Upendra Roy
*Attorney, Agent, or Firm*—Harry A. Wolin

[57] ABSTRACT

A backside metalization scheme for semiconductor devices includes a vanadium layer disposed on the backside of a wafer and a silver layer disposed on the vanadium layer. An optional intermediate layer comprising either a mixture of vanadium and silver or nickel may be disposed between the vanadium layer and the silver layer. The vanadium layer exhibits excellent adhesion characteristics on the backside of wafers having a finish at least as fine as a 300 grit equivalency while the silver layer exhibits excellent solderability characteristics.

11 Claims, 1 Drawing Sheet

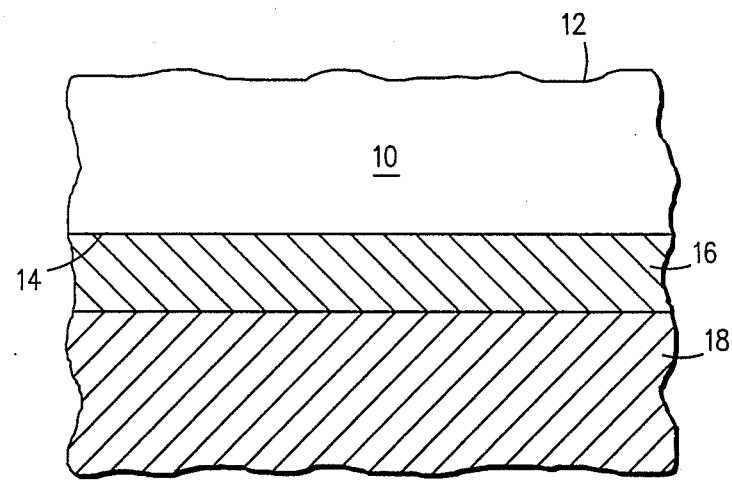
FIG. 1
FIG. 2
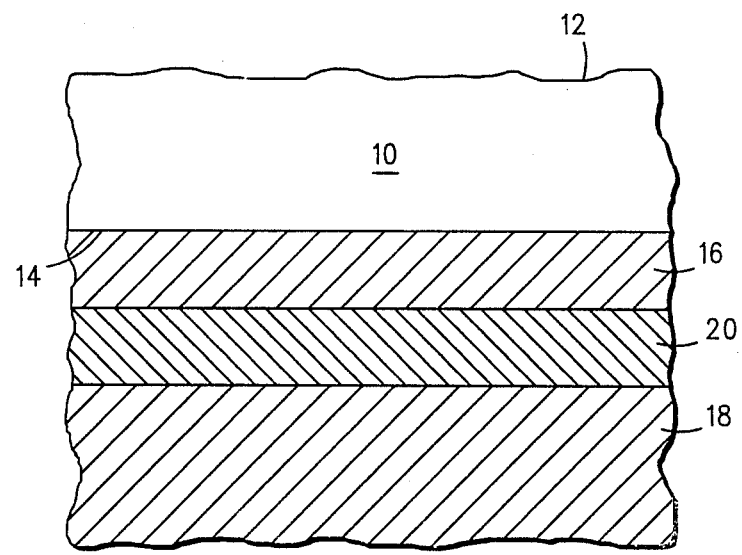

BACKSIDE METALLIZATION SCHEME FOR SEMICONDUCTOR DEVICES

BACKGROUND OF THE INVENTION

This invention relates, in general, to semiconductor devices and more particularly to a backside metallization scheme for semiconductor devices.

Backside metallization schemes of this type generally must have three main properties. First, the layer disposed directly on a wafer must adhere to that wafer. Second, the outer surface of the metallization scheme must be solderable so that the semiconductor device may be bonded to lead frames and the like. Third, the metallization scheme itself must not come apart. Existing metallization schemes encounter various problems in regards to the above properties.

One existing metallization scheme includes a chromium layer disposed directly on the backside of a wafer, an intermediate layer of silver and chromium disposed on the chromium layer and a silver layer disposed on the intermediate layer. The silver layer exhibits excellent solderability and the scheme, in general, does not come apart. However, while the chromium layer adheres well to the backside of silicon wafers having a relatively rough surface (approximately 300 grit equivalency), the adhesion of the chromium layer to the silicon wafer backside decreases as the surface becomes finer. When a chromium layer is disposed directly on the backside of a silicon wafer having a 2000 grit equivalency, the adhesion of the chromium to the silicon is extremely poor.

Another metallization scheme of this type includes forming a vanadium layer directly on a wafer, a nickel layer on the vanadium layer and then, an optional gold-germanium layer may be formed on the nickel layer. Vanadium has excellent adhesion properties in conjunction with silicon. However, the nickel layer does not have good solderability characteristics in this context. Further, the optional gold-germanium layer does not have good solderability characteristics in this context and is very expensive to employ. Therefore, it would be highly desirable to have a metallization scheme that has good adherence to smooth wafers, excellent solderability characteristics and that will not come apart during the lifetime of the semiconductor device.

SUMMARY OF THE INVENTION

Accordingly, it is an object of the present invention to provide a backside metallization scheme for semiconductor devices that has good adhesion to relatively smooth wafer surfaces.

Another object of the present invention is to provide a backside metallization scheme for semiconductor devices that has excellent solderability characteristics.

A further object of the present invention is to provide a backside metallization scheme for semiconductor devices that remains intact during the device lifetime.

Yet another object of the present invention is to provide a backside metallization scheme for semiconductor devices that is relatively low in cost.

The foregoing and other objects and advantages are achieved in the present invention by one embodiment in which, as a part thereof, includes a vanadium layer disposed directly on the backside of a wafer, and a silver layer disposed on the vanadium layer. An optional intermediate layer comprised of either a mixture of vanadium and silver or of nickel may be disposed between the vanadium layer and the silver layer. It had previously been believed that the combination of vanadium and silver could not be employed in backside metallization schemes because the vanadium/silver system exhibits immiscibility in both solid and liquid states (See Smith, Bulletin of Alloy Phase Diagrams 1981, Volume 2, No. 3, pages 343–44).

A more complete understanding of the present invention can be attained by considering the following detailed description in conjunction with the accompanying drawings.

BRIEF DESCRIPTION OF THE DRAWINGS

FIG. 1 is a highly enlarged cross-sectional view of an embodiment of a backside metallization scheme for semiconductor devices; and FIG. 2 is a highly enlarged cross-sectional view of another embodiment of a backside metallization scheme for semiconductor devices.

DETAILED DESCRIPTION OF THE INVENTION

FIG. 1 is a highly enlarged cross-sectional view of an embodiment of a backside metallization scheme for semiconductor devices. FIG. 1 depicts a wafer 10 having a frontside 12 and a backside 14. In this embodiment, wafer 10 is comprised of silicon although one skilled in the art will understand that it is possible to employ wafers comprised of many other well-known materials. Generally, frontside 12 of wafer 10 will have a semiconductor structure or a series of semiconductor structures formed thereon or therein. Although a backside metallization scheme is disclosed herein, it is also possible to employ the scheme on the frontside of a wafer.

Backside 14 of silicon wafer 10 has been ground so that it has a surface finish at least as fine as a 300 grit equivalency. Many metals will not adhere to silicon having this smooth a surface. However, vanadium layer 16 shown disposed on backside 14 of silicon wafer 10 has been found to adhere well to silicon wafers having finishes well in excess of a 2000 grit equivalency. Vanadium layer 16 has a thickness in the range of 500 to 3,000 angstroms and may be either sputtered or evaporated onto backside 14 of wafer 10.

A silver layer 18 is shown disposed on vanadium layer 16. Silver layer 18 has a thickness in the range of 10,000 to 20,000 angstroms and may be formed by either sputtering or evaporation. Silver has excellent solderability characteristics to the various die bond materials used to attach semiconductor chips to leadframes and the like and therefore, is highly desirable as the final layer of a backside metallization scheme. Since vanadium and silver exhibit immiscibility in both solid and liquid states (see Summary of the Invention) those skilled in the art have been led to believe that these two materials could not be used in direct contact with each other. However, silver layer 18 and vanadium layer 16 have exhibited more than adequate adhesion to each other in this application.

FIG. 2 is a highly enlarged cross-sectional view of another embodiment of a backside metallization scheme for semiconductor devices. Wafer 10 having frontside 12 and backside 14 along with vanadium layer 16 disposed thereon are virtually the same as those described in FIG. 1 above. However, an intermediate layer 20 is shown disposed on vanadium layer 16. Intermediate layer 20 may be comprised of a mixture of vanadium and silver that has a thickness in the range of 3,000 to 7,000 angstroms. Intermediate layer 20 may be formed either by evaporation or sputtering. It should be understood that both materials are evaporated or sputtered simultaneously. Intermediate layer 20, has a vanadium:-silver ratio in the range of 10:90 to 50:50. Again, although the silver/vanadium system exhibits immiscibility in both solid and liquid states, intermediate layer 20, comprised of a mixture of vanadium and silver, adheres adequately.

Intermediate layer 20 may also be comprised of nickel. Nickel intermediate layer 20 may be either evaporated or sputtered on vanadium layer 16 and has a thickness in the range of 500 to 3,000 angstroms. Nickel adheres well to both vanadium layer 16 and silver layer 18 which is later disposed on intermediate layer 20.

Thus it is apparent that there has been provided, in accordance with the invention, an improved backside metallization scheme for semiconductor devices. While specific embodiments of the invention have been shown and described, further modifications and improvements will occur to those skilled in the art. It is desired that it be understood, therefore, that this invention is not limited to the particular form shown and it is intended in the appended claims to cover all modifications which do not depart from the spirit and scope of this invention.

What is claimed is:

1. A metallization scheme for semiconductor devices comprising:
    a vanadium layer having a thickness in the range of 500 to 3,000 angstroms disposed on the backside of a wafer; and
    a silver layer having a thickness in the range of 10,000 to 20,000 angstroms disposed on said vanadium layer.

2. The metallization scheme of claim 1 wherein the vanadium layer is disposed on the backside of a silicon wafer, said backside of said silicon wafer having a backside finish at least as fine as a 300 grit equivalency.

3. The metallization scheme of claim 1 further comprising an intermediate layer comprising a mixture of vanadium and silver, said intermediate layer being disposed between the vanadium layer and the silver layer.

4. The metallization scheme of claim 1 further comprising an intermediate layer comprising nickel, said intermediate layer being disposed between the vanadium layer and the silver layer.

5. The metallization scheme of claim 3 wherein the intermediate layer has a vanadium:silver ratio in the range of 10:90 to 50:50.

6. The metallization scheme of claim 4 wherein the intermediate layer has a thickness in the range of 500 to 3,000 angstroms.

7. The metallization scheme of claim 5 wherein the intermediate layer has a thickness in the range of 3,000 to 7,000 angstroms.

8. A backside metallization scheme for semiconductor devices comprising:
    a vanadium layer having a thickness in the range of 500 to 3,000 angstroms disposed on the backside of a silicon wafer;
    an intermediate metal layer disposed on said vanadium layer; and
    a silver layer having a thickness in the range of 10,000 to 20,000 angstroms disposed on said intermediate layer.

9. The metallization scheme of claim 8 wherein the intermediate layer comprises a mixture of vanadium and silver, has a vanadium:silver ratio in the range of 10:90 to 50:50 and has a thickness in the range of 3,000 to 7,000 angstroms.

10. The metallization scheme of claim 8 wherein the intermediate layer comprises nickel and has a thickness in the range of 500 to 3,000 angstroms.

11. The metallization scheme of claim 8 wherein the backside of the silicon wafer has a finish at least as fine as a 300 grit equivalency.

* * * * *